United States Patent [19]

Maxemchuk

[11] 4,106,053
[45] Aug. 8, 1978

[54] DIGITAL SAMPLING RATE CONVERSION OF COLOR TV SIGNAL

[75] Inventor: Nicholas Frank Maxemchuk, Mercerville, N.J.

[73] Assignee: RCA Corporation, New York, N.Y.

[21] Appl. No.: 820,933

[22] Filed: Aug. 1, 1977

[51] Int. Cl.² .............................................. H04N 9/32
[52] U.S. Cl. ........................................ 358/13; 358/11; 358/138
[58] Field of Search ............... 358/11, 13, 133, 138, 358/140, 141; 364/723, 900.01, 900.02; 340/347 DD, 347 M; 179/15 AP; 325/38 R, 144; 235/310

[56] References Cited

U.S. PATENT DOCUMENTS

| 3,946,432 | 3/1976 | Goldberg et al. | 358/13 |
| 4,020,332 | 4/1977 | Crochiere | 364/723 |
| 4,068,266 | 1/1978 | Liao | 358/140 |

OTHER PUBLICATIONS

Goldberg, "PLM NTSC Television Characteristics," SMPTE Journal, Mar. 1976, vol. 85, No. 3, pp. 141-145.

Primary Examiner—John C. Martin
Attorney, Agent, or Firm—H. Christoffersen; Samuel Cohen; Carl V. Olson

[57] ABSTRACT

A converter to translate a sampled color television video signal, consisting of four pulse-code-modulated 8-bit digital samples during each cycle of the color subcarrier, to a corresponding signal consisting of three pulse-code-modulated 8-bit digital samples during each cycle of the color subcarrier. The four 8-bit samples from present and preceeding cycles are stored in several 8-bit input registers. The 8-bit sample in one of the input registers is coupled to an output register once per cycle. Two predetermined weighted combinations of 8-bit samples in predetermined ones of the input registers are coupled to second and third output registers once per cycle.

5 Claims, 8 Drawing Figures

ARITHMETIC UNIT

SRN indicates shift right N places (I.E. divide reg $2^N$)

DIGITAL SAMPLING RATE CONVERSION OF COLOR TV SIGNAL

This invention relates to converters for translating a sampled color television video digital signal consisting of a given number of digital samples during each cycle of the color subcarrier, to a digital signal having a different number of digital samples during each cycle of the color subcarrier. A color television video signal in the usual analog form can be translated to a digital form by making four digital samples per cycle of the subcarrier, or by making three digital samples per cycle of the subcarrier. Since the color subcarrier frequency is 3.58 MHz, the four samples per cycle occur at a rate of 14.32 MHz and provide a very high quality digital signal. Three samples per cycle occur at a lower rate of 10.74 MHz and provide a digital signal which can be more economically transmitted over a narrower band channel. The present invention is useful, for example, to convert from four digital samples per subcarrier cycle to three digital samples per subcarrier cycle. The latter signal is more suitable for economical transmission to and from a satellite in earth orbit. A known method of making the conversion is to use a digital-to-analog converter to convert the signal with four samples per cycle to an analog video signal, and then use an analog-to-digital converter to convert the analog signal to a digital signal with three samples per cycle. This known method introduces distortion which somewhat degrades the quality of the television signal.

According to an example of the invention, a digital-to-digital conversion is made from four samples per color subcarrier cycle to three samples per subcarrier cycle by giving predetermined weights to predetermined digital samples occurring during present and preceding cycles, and by making predetermined combinations of the weighted samples to form three output samples during each cycle of the color subcarrier.

Figure 1:
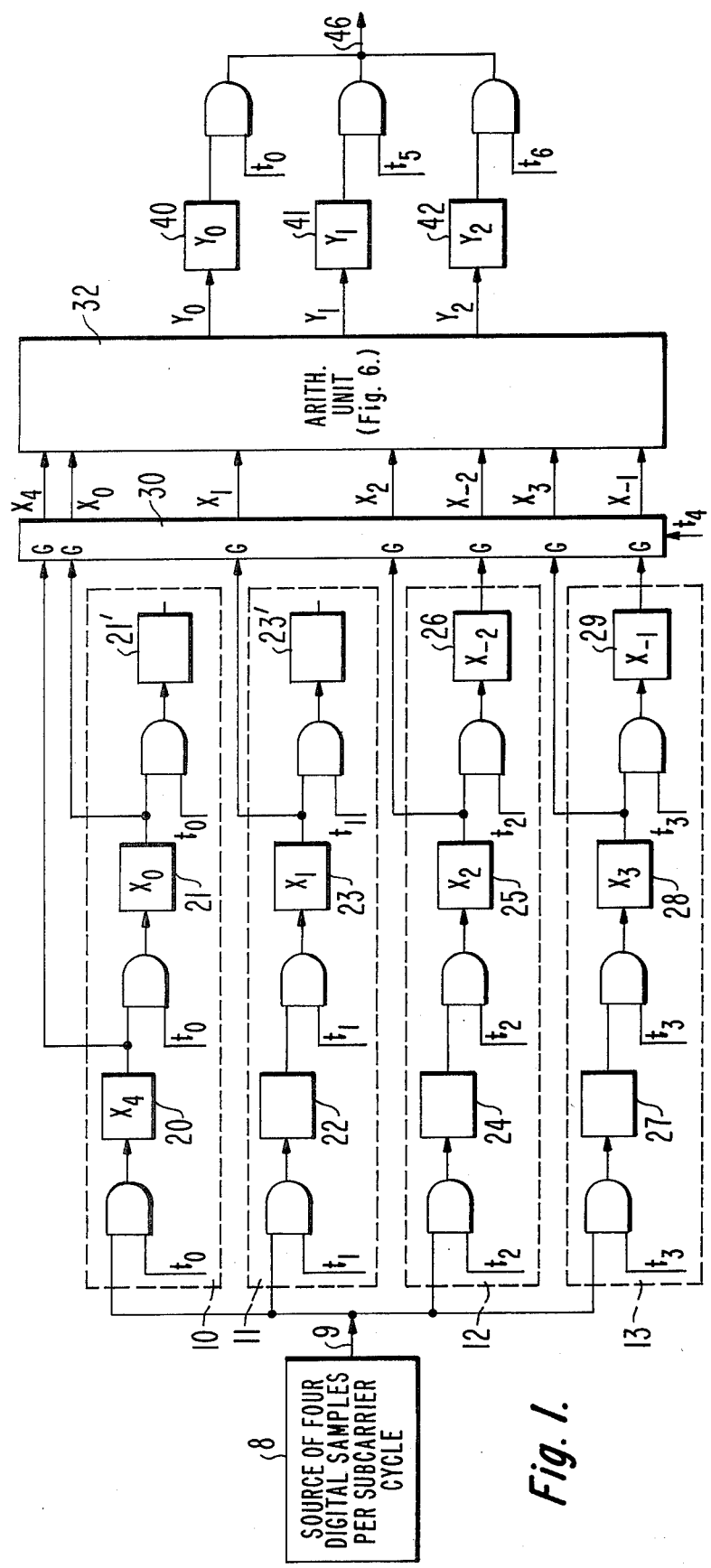
FIG. 1 is a block diagram of a system constructed according to the teachings of the invention.
Figure 2:
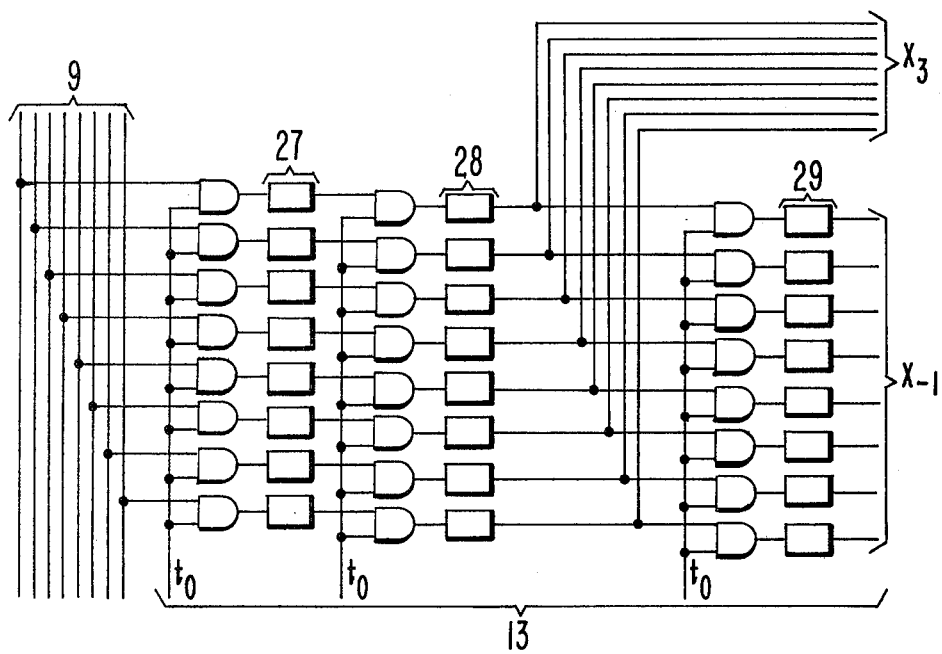
FIG. 2 is a schematic detailed diagram of one portion of FIG. 1.

In FIG. 1, four serial digital samples per color subcarrier cycle from a source 8 are coupled over an 8-conductor bus 9 to inputs of four three-stage 8-bit-parallel shift registers 10, 11, 12 and 13. Three stage shift register 10 operates at time $t_0$ to gate an 8-bit digital sample in parallel from first-stage 8-bit register 20 to second-stage 8-bit register 21, and to gate a later-received 8-bit sample from 8-conductor bus 9 to first-stage 8-bit register 20. A third-stage register 21 is not used. Three-stage shift register 11 operates in a similar manner at time $t_1$ to gate a sample from first-stage register 22 to second-stage register 23, and a later sample from bus 9 to first-stage register 22. A third-stage register 23 is not used. Likewise, three-stage shift register 12 operates at time $t_2$ to gate a sample from second-stage register 25 to third-stage register 26, a later sample from first-stage register 24 to second-stage register 25, and a still later sample from bus 9 to first-stage register 24; and three-stage shift register 13 operates at time $t_3$ to gate a sample from second-stage register 28 to third-stage register 29, a later sample from first-stage register 27 to second-stage register 28, and a still later sample from bus 9 to first-stage register 27. The three-stage shift register 13 is shown in detail in FIG. 2. Each of stages 27, 28 and 29 includes a storage register for 8-bit samples.

At a time $t_4$ following time $t_3$, the four registers 20, 22, 24 and 27 contain respective 8-bit digital samples received during a present cycle of the color subcarrier, the four registers, 21, 23, 25 and 28 contain respective 8-bit samples received during a cycle of the color subcarrier previous to the present cycle, and registers 26 and 29 contain 8-bit samples received during a next earlier cycle of the color subcarrier.

Figure 3:
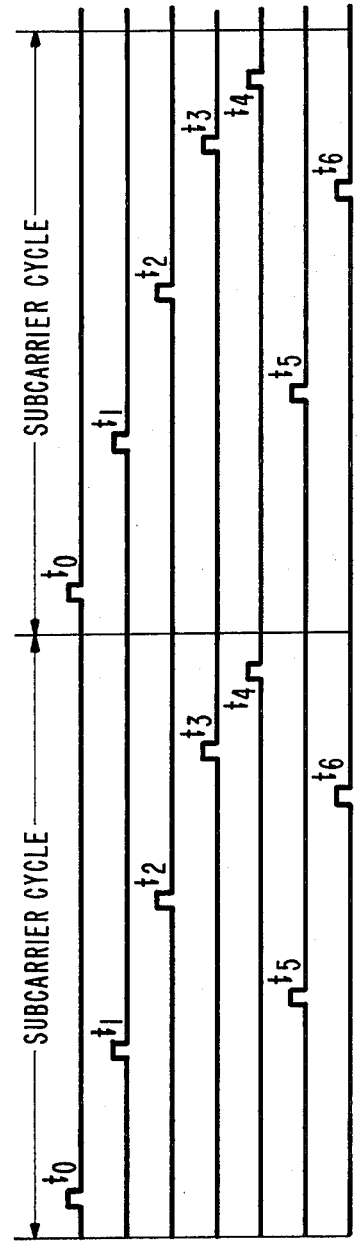
FIG. 3 is a timing diagram which will be referred to in describing the operation of FIG. 1.

At this time $t_4$, a system of parallel gates 30 transfers the 8-bit samples in each of seven registers 20, 21, 23, 25, 26, 28 and 29 to an arithmetic unit 32. The timing pulses $t_0$ through $t_4$ repeated during each cycle of the subcarrier are shown in FIG. 3.

Figure 4:
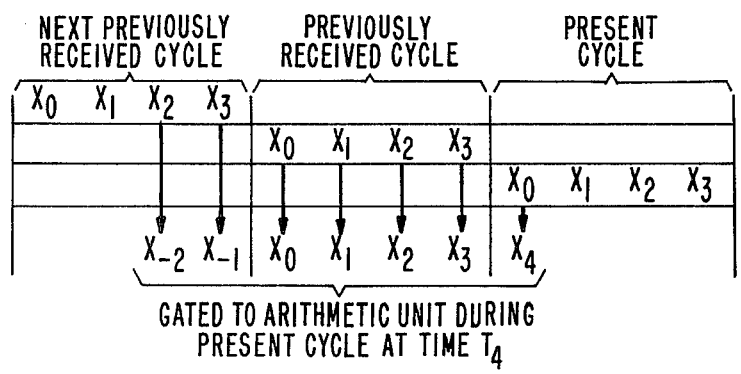
FIG. 4 is a table showing the nomenclature applied to successively-received digital samples.

FIG. 4 shows the nomenclature used for successively-received digital samples. The first sample $x_0$ of the present cycle is called $x_4$ and is contained in register 24 at time $t_4$. The four samples $x_0$, $x_1$, $x_2$ and $x_3$ of the previously received cycle are contained in registers 21, 23, 25 and 28, respectively, at time $t_4$. The two samples $x_2$ and $x_3$ of the next-previously received cycle are called $x_{-2}$ and $x_{-1}$ and are contained in registers 26 and 29 respectively, at time $t_4$.

Figure 5:
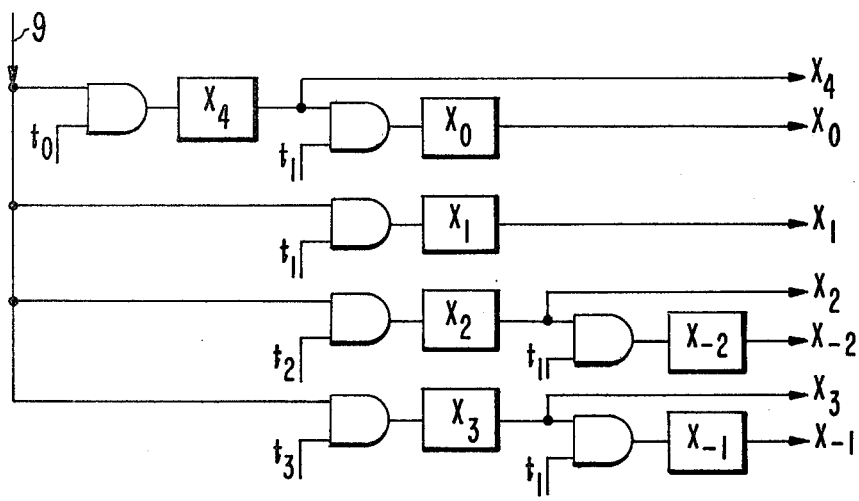
FIG. 5 is a block diagram of an alternative construction for the shift registers in FIG. 1.

It will be noted that some of the registers 20 through 29 in the four three-stage shift registers 10 through 13 are not used in the specific example illustrated in FIG. 1. A more economical implementation including simply seven storage registers and transfer gates for the four 8-bit samples is shown in FIG. 5. The operation of FIG. 5 is clear when one begins with acceptance of the first sample $x_2$ at time $t_2$ and proceeds through times $t_3$, $t_0$, $t_1$, $t_2$, $t_3$ and $t_0$.

The arithmetic unit 32 in FIG. 1 which will be described in connection with FIG. 6, produces three 8-bit digital signal samples which are present at time $t_4$ of each cycle of the color subcarrier in 8-bit registers 40, 41 and 42, and these samples are successively gated out in serial fashion at times $t_0$, $t_5$ and $t_6$ of the next following cycle to an 8-conductor output line 46, where they form a serial succession of 8-bit samples each transmitted in parallel on eight conductors.

Figure 6:
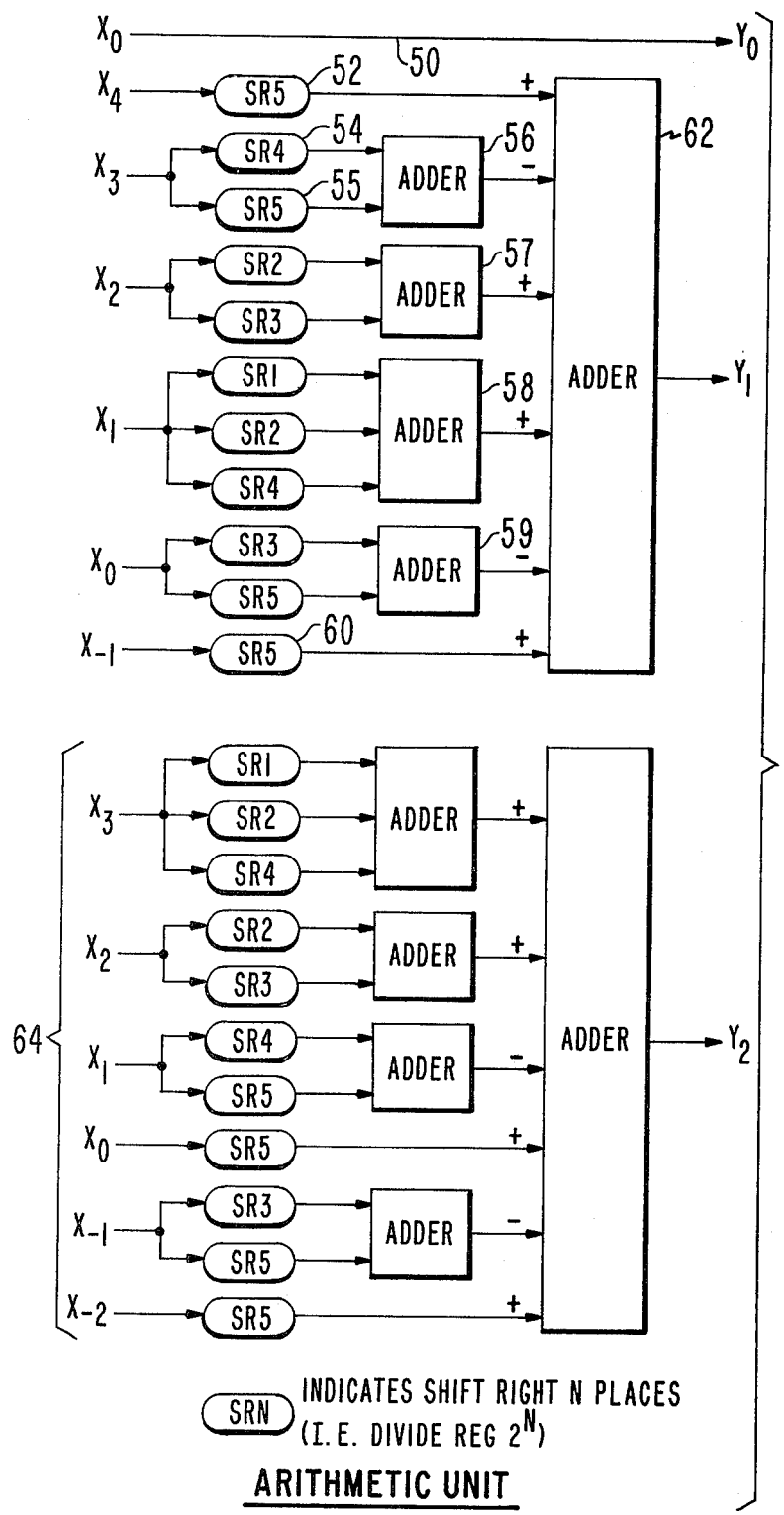
FIG. 6 is a block diagram of an arithmetic unit useful in the system of FIG. 1.
Figure 7:
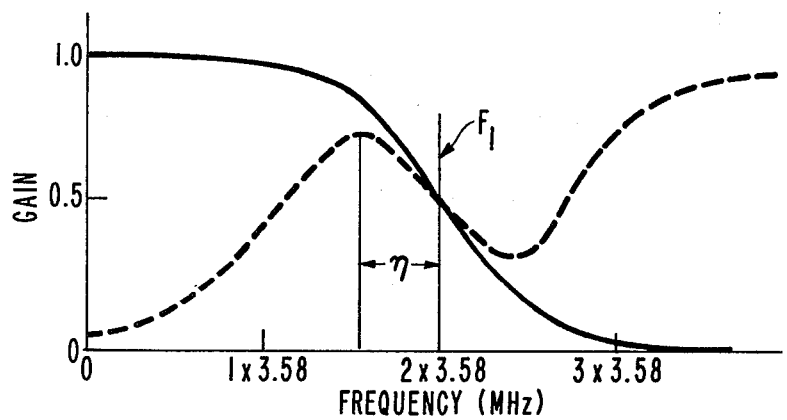
FIG. 7 is a chart of filter characteristics which will be referred to in describing how weighting constants are derived.

The arithmetic unit shown in detail in FIG. 6 includes a connection 50 from input terminal $x_0$ to $y_0$, whereby the $x_0$ digital sample of the four-samples-percycle output signal becomes the $y_0$ digital sample of the three-sample-per-cycle output signal.

The $y_1$ output of the arithmetic unit is derived by combining weighted samples of inputs $x_4$, $x_3$, $x_2$, $x_1$, $x_0$ and $x_{-1}$. The 8-bit input digital sample $x_4$ is divided by $2^5$ by shifting the signal five spaces to the right in a shift register unit 52 labeled SR5. Sample $x_3$ is divided by $2^4$ in unit 54 labeled SR4, and is divided by $2^5$ in a unit 55 labeled SR5. The outputs of units 54 and 55 are added in an adder 56. Other digital samples are divided and added by adders 57, 58 and 59 in a manner obvious from the drawing. The outputs of unit 52, adders 56 through 59 and unit 60 are combined in an adder 62, which produces an output sample $y_1$. In a similar manner, the units and adders 64 produce an output sample $y_2$.

The particular numbers by which the four input samples are divided, and the combinations in which the divided samples are added, and the sums combined in the arithmetic unit of FIG. 6 are determined by a technique for determining the sample values at a sampling rate equal to three times the color subcarrier. The description of the technique is divided into three sections. In the first section the constructed sample will be represented as a weighted sum of the original samples, the weightings being determined by a filter. Several filters will be investigated, and the one which uses the fewest of the original samples to construct the new sample will be chosen. In the second section, the signal-to-distortion ratio of the resulting signal will be determined. To determine this ratio, the spectrum of a typical TV signal will be used. The distortion will be weighted to reflect the expected severity of distortion in different segments of the frequency band. In the third section, the weighting factors will be modified, so that the circuit can be implemented using adders rather than dividers, and then perturbed to obtain a local maximum in the signal-to-distortion ratio. The resulting circuit will use between one and six old sample values to construct a new sample. It will provide a 74 dB signal-to-weighted distortion ratio in a 4.5 MHz band.

I. Choice of Weighting Functions

A signal X(t), sampled once every T seconds, results in a signal $$\sum_{N=-\infty}^{\infty} X(t) \delta(t - NT).$$

The frequency spectrum of the resulting signal contains the original frequency spectrum plus displaced versions of that spectrum. To reconstruct the original signal the sampled signal is filtered by g(t), which eliminates the displaced spectra. The resulting signal is:

$$y(t) = g(t) * \sum_{N=-\infty}^{\infty} X(t) \delta(t - NT) = \sum_{N=-\infty}^{\infty} X(NT) g(T - NT).$$

If this signal is sampled every 4/3 T seconds, $$y(k \tfrac{4}{3} T) = \sum_{N=-\infty}^{\infty} X(NT) g(k \tfrac{4}{3} T - NT) \quad (1)$$

The new samples are thus represented as a weighted sum of the previous samples. The conversion between sampling rates can be effected by multiplying the old samples by constants, determined by a filter, and summing. Due to the symmetry of the problem, the same weighting functions will be used to determine every third one of the constructed samples. Separate circuits must be constructed to determine y(0), y (4/3 T), and y (8/3 T), and this circuitry can be used to determine all other samples.

To realize this circuit, the summation in equation 1 must be truncated to some finite value. This value depends on the filter chosen and the amount of distortion which can be tolerated. Initially, all weighting coefficients less than 1/512 were ignored. The reason for choosing this level is that the sampled signal is quantized to 256 levels. If the weighting factor is less than 1/512, it cannot add more than ½ a quantization level to the constructed sample, and will most likely not effect the final value.

Using this criterion, over 200 of the original samples are required to construct each new sample, if a rectangular low pass filter is used to determine the weighting coefficients. This means the conversion circuit would require over 600 multipliers and adders. To reduce the complexity of this circuit filters with more gradual skirts in the frequency domain were considered. Among the filters considered were those with triangular, raised-cosine and gaussian skirts.

The filters are flat in the frequency range $0 \rightarrow f_1$, have a skirt in the frequency range $f_1 \rightarrow f_2$, and are zero above $f_2$. In general, the larger the skirt the smaller the number of original samples required to construct a new sample. Assuming that the original signal had spectral components from 0 to 6 MHz, and that we are interested in the spectrum between 0 and 4.5 MHz in the constructed signal, the following phenomena are encountered as the skirt is increased:

If $f_1$ is less than 4.5 MHz the signal spectrum is distorted.

If $f_2$ is greater than 5.37 MHz, the spectrum of the original signal between 5.37 and 6 MHz is aliased into the range between 4.74 and 5.37 MHz. This component does not affect the region of interest in the new signal.

If $f_2$ is greater than 8.32 MHz, the displaced version of the original spectrum is not completely eliminated and is aliased back into the constructed signal spectrum.

Taking these phenomena into account, and assuming the signal energy in the range between 4.2 and 6 MHz is small in comparison to the energy between 0 and 4.2 MHz, skirts were designed to fill the band between 4.2 and 10.12 MHz. A raised-cosine skirt in this range reduced the number of significant weighting coefficients from over 200, for the low-pass filter, to 21. A filter with a gaussian skirt was investigated. The response of this filter was down 50 dB at 10.74 MHz, where the shifted version of the color subcarrier occurs. This requirement made this filter look more like a low-pass filter than the raised cosine filter, and, increased the number of significant weighting coefficients.

It is possible to obtain faster convergence in the time domain using gaussian filters, than it is using raised cosine filters. This benefit was not realized in this instance because of the severity of the constraint on attenuation at a high frequency. Various arrangements of gaussian functions were investigated to try to obtain this potential improvement, and, it was found that the convergence could be made faster by defining a split gaussian filter, as shown in FIG. 5, and as defined by the following equations:

$$G(f) = \begin{cases} 1 - k1 \text{ EXP } [-(F - (F1 + \eta))^2/k2] & F \leq F1 \\ k1 \text{ EXP } [-(F - (F1 - \eta))^2/k2] & F > F1 \end{cases}$$

The following constraints were placed on the design of this filter:

Both the function and its first derivative are continuous at F1.

The attenuation is down 53 dB at 3×3.58 MHz, where the displaced color subcarrier occurs.

The signal-to-distortion is 53 dB at 3.58 MHz. The constraints set $k1 = \text{EXP}[\eta^2/k2 - Ln2]$ and $$k2 = \frac{(3.58)^2 + 2 \cdot 3.58 \cdot \eta}{2.65 \, Ln10 - Ln2}.$$

Therefore, $k1$ and $k2$ are determined by picking $\eta$. The constant $\eta$ was adjusted to obtain the fewest significant weighting coefficients. This filter reduced the number of significant weighting coefficients from 21 to 9.

II. Signal/Distortion

The filtering techniques introduce distortion into the signal spectrum, because of the phenomena described in Section I, and the series truncation performed. This distortion will be calculated.

The constructed signal is:

$$y(t) = \sum_{N=-\infty}^{\infty} F_N[\bar{X}] \, \delta(t - N\frac{4}{3}T),$$

where $F_N(\bar{X})$ is a function of the original samples.

| | 0 T | 2T | 3T 4T 5T | 6T | 7T |
|---|---|---|---|---|---|
| original samples | ↑ ↑ | ↑ | ↑ ↑ ↑ | ↑ | ↑ |
| constructed samples | ↑ ↑ 0 $\frac{4}{3}T$ | ↑ $\frac{8}{3}T$ | ↑ 4T | ↑ | ↑ |

It is noted that the relationship between $y(k(4/3)T)$ and the original samples $X(NT)$, is the same as the relationship between $y(k+3j)(4/3)T)$ and the original samples $X((N+4j)T)$. The constructed signal can therefore be represented as:

$$y(t) = \sum_{N=-\infty}^{\infty} [F_0(X(t)) \, \delta(t - 4NT) +$$

$$F_1(X(t)) \, \delta(t - \frac{4}{3}T - 4NT) + F_2(X(t)) \, \delta(t - \frac{8}{3}T - 4NT)],$$

where $$F_j(X(t)) = \sum_i A_{i,j} X(t - j\frac{4}{3}T - iT).$$

That is, the $F_j(X(t))$ is the weighted sum of certain of the samples.

Every third one of the constructed samples lines up with one of the original samples. It was found that when the filter has the type of symmetry, about 2·3.58 MHz displayed by the split gaussian and raised cosine filters, the constructed sample equals the original sample it lines up with. Furthermore, it was noted that the coefficient multiplying the sample at $T-iT$, when determining the sample at 4/3 T, is the same as the coefficient multiplying the sample at $3T+iT$, when determining the sample at 8/3 T. This is expected from the symmetry of the samples in the time domain. The constructed signal can therefore be represented as:

$$y(t) = X(t) S(t) + \sum_i A_i X(t - (i + \frac{1}{3})T) S(t - \frac{4}{3}T),$$

$$+ \sum_i A_i X(t + (i + \frac{1}{3})T) S(t - \frac{8}{3}T),$$

where, $$S(t) = \sum_{N=-\infty}^{\infty} \delta(t - 4NT) = \frac{1}{4T} \sum_{k=-\infty}^{\infty} e^{-j2\pi kt/4T}$$

Taking the fourier transform of the constructed signal, and simplifying, one obtains, $$Y(f) = \frac{1}{3} \sum_k X(f - Kf_c) [1 + 2 \sum_i A_i \cos(\pi/2(k(i-1) - f/f_c(i + 1/3))],$$

where $f_c$ is 3.58 MHz, and $X(f)$ is the spectrum of the original TV signal.

To construct the estimated signal from $Y(f)$, it is passed through a low pass filter with a cut-off at 4.5 MHz. The distortion component is:

$$N(f) = \begin{cases} Y(f) - S(f) & -4.5 \times 10^6 < f < 4.5 \times 10^6 \\ 0 & \text{elsewhere} \end{cases}$$

To calculate the distortion it is necessary to assume a signal spectrum. The spectrum used in these calculations is taken from D. G. Fink, Television Engineering Handbook, McGraw-Hill Book Company, 1957, pg. 10–22. According to Fink, the spectra of a set of 27 slides provided by the Eastman Kodak Company for the National Television System Committee, has the following characteristics:

The luminance component decreases in amplitude at a rate of approximately 6 dB per octave in the range from 0.0157 to 0.75 MHz, 10 dB per octave from 0.75 to 4 MHz, and 12 dB per octave above 4 MHz.

The chrominance components decrease at about 7 dB per octave in the range from 15.7 to 400 kHz, 5 dB per octave from 0.4 to 1.5 MHz on the side toward the picture carrier, and 9 dB per octave from 0.4 to 1.5 MHz on the side away from the picture carrier.

The ratio of the peak luminance amplitude to the peak chrominance amplitude is about 5 to 1.

For a particular set of weighting coefficients, this calculation provides a distortion spectrum for the band of the TV signal. It has been suggested that distortion in all regions of the band are not equally objectionable. In particular, it is felt that distortion in the low frequency region of the band and distortion in the region near the color subcarrier is much more objectionable than distortion near the 2 MHz region, and distortion near the high end of the band. While a quantitative measure of objectionability for this type of distortion is not available, several weighting functions for white noise have been established. The CCIR noise weighting function:

$$W(F) = \frac{1 + (\frac{F}{F_3})^2}{(1 + (\frac{F}{F_1})^2)(1 + (\frac{F}{F_2})^2)},$$

$F_1 = 0.27$ MHz,
$F_2 = 1.37$ MHz,
$F_3 = 0.39$ MHz, emphasizes distortion in the regions in which it should be most objectionable. This function was uesd to weight the distortion power spectrum.

III. Modification of Multiplication Coefficients

The significant multiplicative coefficients, obtained from the split gaussian filter, were:

$A_{-4} = -0.00986$
$A_{-3} = 0.03516$
$A_{-2} = -0.10840$
$A_{-1} = 0.38672$
$A_0 = 0.81250$
$A_1 = 0.15820$
$A_2 = 0.05176$
$A_3 = 0.01465$
$A_4 = 0.00293$.

To implement this circuit in hardware it is desirable to represent $A_i$ as $$\pm \sum_{j=1}^{L} b_{i,j} 2^{-L},$$

where $b_{i,j}$ is zero or one. This representation enables the multiplication to be performed by adding displaced versions of the original sample, rather than performing multiplication by a constant less than one. In addition, it may be possible to modify these coefficients to improve the signal to distortion ratio.

The following procedure was used to obtain a set of $A_i$ which can be represented in the desired manner, and provide a local optimum in the signal-to-weighted distortion ratio. Letting $L = 10$, the coefficients $A_i$ were approximated by $$A_i = \sum_{j=1}^{10} b_{i,j} 2^{-j}.$$

The signal-to-weighted distortion ratio was calculated for this set of approximate $A_i$, and, for each of the eighteen sets of $A_i$ in which one of these $A_i$ were increased or decreased by $2^{-L}$. The approximate set of $A_i$ was replaced by the set of perturbed $A_i$ which provided the largest signal-to-distortion ratio. The new set of $A_i$ were perturbed, and, the procedure was repeated until a local optimum was obtained. The approximate $A_i$, resulting from this procedure, were approximated by a new set of $A_i$ with $L = 8$. The perturbation procedure was repeated to obtain a new local optimum. Finally, the entire procedure was repeated for $L = 6$. The following set of $A_i$ resulted from this procedure:

$A_{-4} = 0$
$A_{-3} = 0.03125 = 2^{-5}$
$A_{-2} = -0.09375 = -[{-4} + 2^{-5}]$
$A_{-1} = 0.375 = 2^{-2} + 2^{-3}$
$A_0 = 0.8125 = 2^{-1} + 2^{-2} + 2^{-4}$
$A_1 = -0.15625 = -[2^{-3} + 2^{-5}]$
$A_2 = 0.03125 = 2^{-5}$
$A_3 = 0$
$A_4 = 0$

The peak-to-peak signal power-to-mean square weighted noise power was calculated as follows. The mean square signal power was calculated by numerically integrating the square of the amplitude signal spectrum, between 0 and 4.5 MHz. Assuming the signal levels to be uniformly distributed between $+V$ and $-V$, $S_{p,p}$ was calculated to be $12 \cdot S_{m,s}$. The amplitude spectrum of the noise was calculated by the procedure specified in section II. The square of this spectrum was weighted by the CCIR noise weighting factor and numerically integrated. The resulting signal-to-distortion ratio for the approximate set of $A_i$ is 73.9 dB.

Figure 8:
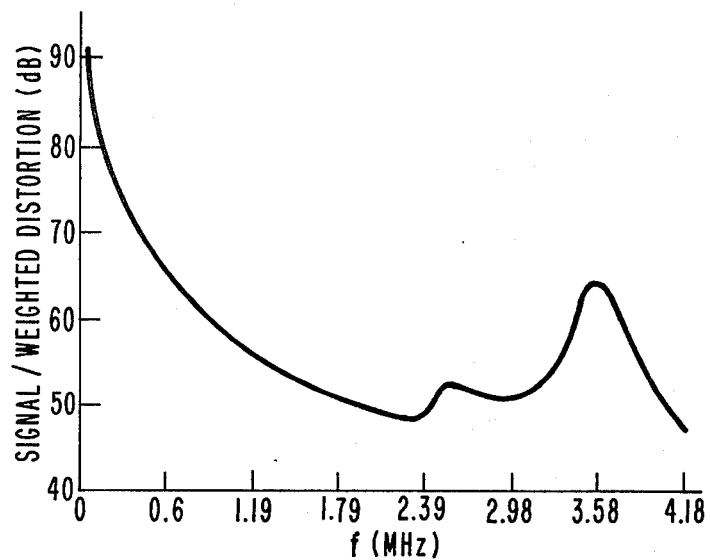
FIG. 8 is a chart of calculated variations in signal/distortion ratio with frequency when described approximate coefficients are used.

The procedure was repeated for small intervals in the band of the signal. The signal-to-weighted distortion ratio at different frequencies in the band is plotted in FIG. 8.

Using the results of the foregoing calculations, seven digital samples $x_{-2}, x_{-1}, x_0, x_1, x_2, x_3$ and $x_4$ as shown in FIGS. 1 and 4 are weighted and combined in the manner illustrated in the arithmetic unit shown in FIG. 6. The converter system of FIG. 1 operates in a manner which has been described and with the timing shown in FIG. 3 to translate a video source of four serial digital 8-bit samples per cycle of the color subcarrier signal on 8-bit bus 9 to three serial digital 8-bit samples per cycle of the color subcarrier signal on 8-bit output bus 46.

What is claimed is:

1. A converter to translate a color television video signal consisting of four digital samples during each cycle of the color subcarrier to a corresponding signal consisting of three digital samples during each cycle of the color subcarrier, comprising
    a plurality of input registers connected to receive a respective plurality of successive digital samples,
    three output registers for three output digital samples per cycle of the color subcarrier,
    means to couple the contents of one of said input registers to one of said three output registers,
    means to weight and combine the contents of predetermined ones of said input registers and couple the result to a second one of said three output registers,
    means to weight and combine the contents of predetermined ones of said input register and couple the result to a third one of said three output registers, and
    means to couple the contents of said three output registers in sequence at the cycle rate to an output channel.

2. A converter according to claim 1 wherein said digital samples each consist of plurality of pulse code modulated bits, and each of said input registers and output registers consists of an equal plurality of parallel stages.

3. A converter according to claim 2 wherein said input registers comprise four multi-bit shift registers each receiving and shifting in parallel the plurality of bits of a respective one of the four digital samples at the cycle rate, whereby stages of the shift register contain digital samples from a present cycle and at least one preceding cycle.

4. A converter according to claim 1 which each of said means to weight and combine the contents of predetermined ones of said input registers comprises arithmetic shift registers in which a digital sample is shifted to the right to divide the digital number by the number of shifts.

5. A converter according to claim 4 wherein each of said means to weight and combine the contents of predetermined ones of said input registers also comprises adder means for combining the outputs of said arithmetic shift registers.

* * * * *